(12) United States Patent
Hsiao et al.

(10) Patent No.: US 9,570,561 B2
(45) Date of Patent: Feb. 14, 2017

(54) MODIFIED CHANNEL POSITION TO SUPPRESS HOT CARRIER INJECTION IN FINFETS

(71) Applicant: Taiwan Semiconductor Manufacturing Co., Ltd., Hsin-Chu (TW)

(72) Inventors: Ru-Shang Hsiao, Jhubei (TW); Yi-Ju Chen, Tainan (TW); Sheng-Fu Yu, Chiayi (TW); I-Shan Huang, Tainan (TW); Kuan Yu Chen, Tainan (TW); Li-Yi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 36 days.

(21) Appl. No.: 14/179,601

(22) Filed: Feb. 13, 2014

(65) Prior Publication Data

US 2015/0228731 A1  Aug. 13, 2015

(51) Int. Cl.
*H01L 29/36* (2006.01)
*H01L 29/78* (2006.01)
*H01L 27/088* (2006.01)
*H01L 29/66* (2006.01)
*H01L 21/265* (2006.01)

(52) U.S. Cl.
CPC ......... *H01L 29/36* (2013.01); *H01L 21/26586* (2013.01); *H01L 27/0886* (2013.01); *H01L 29/66803* (2013.01); *H01L 29/7854* (2013.01); *H01L 2029/7858* (2013.01)

(58) Field of Classification Search
CPC ...... H01L 21/265; H01L 27/088; H01L 29/36; H01L 29/66; H01L 29/78; H01L 29/7854; H01L 27/0886; H01L 29/66803; H01L 21/26586
See application file for complete search history.

(56) References Cited

U.S. PATENT DOCUMENTS

| | | | |
|---|---|---|---|
| 2005/0095793 A1* | 5/2005 | Lee | H01L 29/41791 438/294 |
| 2005/0173768 A1* | 8/2005 | Lee et al. | 257/401 |
| 2006/0231907 A1* | 10/2006 | Kim | H01L 29/42384 257/401 |

(Continued)

*Primary Examiner* — Fazli Erdem
(74) *Attorney, Agent, or Firm* — Eschweiler & Associates, LLC (57) ABSTRACT

Some embodiments relate to an integrated circuit (IC) including one or more finFET devices. A finFET includes a fin of semiconductor material extending upwards from a semiconductor substrate. First and second source/drain regions, which have a first doping type, are spaced apart laterally from one another in the fin. A channel region is disposed in the fin and physically separates the first and second source/drain regions from one another. The channel region has a second doping type opposite the first doping type. A conductive gate electrode straddles the fin about the channel region and is separated from the channel region by a gate dielectric. A shallow doped region, which has the first doping type, is disposed near a surface of the fin around upper and sidewall fin regions. The shallow doped region extends continuously under the gate electrode between outer edges of the gate electrode.

19 Claims, 8 Drawing Sheets

200a (56) References Cited

U.S. PATENT DOCUMENTS

| | | | |
|---|---|---|---|
| 2008/0111163 A1* | 5/2008 | Russ | H01L 29/458 257/280 |
| 2008/0185650 A1* | 8/2008 | Chen | H01L 29/785 257/348 |
| 2009/0001464 A1* | 1/2009 | Booth, Jr. | H01L 29/785 257/347 |
| 2010/0207211 A1* | 8/2010 | Sasaki | H01L 29/785 257/347 |
| 2013/0175624 A1* | 7/2013 | Chang | H01L 29/785 257/347 |
| 2013/0193513 A1* | 8/2013 | Bryant | H01L 29/785 257/347 |
| 2014/0264492 A1* | 9/2014 | Lee | 257/288 |
| 2014/0312393 A1* | 10/2014 | Rodder et al. | 257/288 |
| 2015/0108544 A1* | 4/2015 | Ching | H01L 21/82382 257/192 |

* cited by examiner

MODIFIED CHANNEL POSITION TO SUPPRESS HOT CARRIER INJECTION IN FINFETS

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators can continue to overcome the technological challenges associated with it. In particular, one trend to increase transistor density in recent years is to go to three dimensional gates—so called "FinFETs"—which tend to improve performance compared to conventional planar device at equal power supply voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
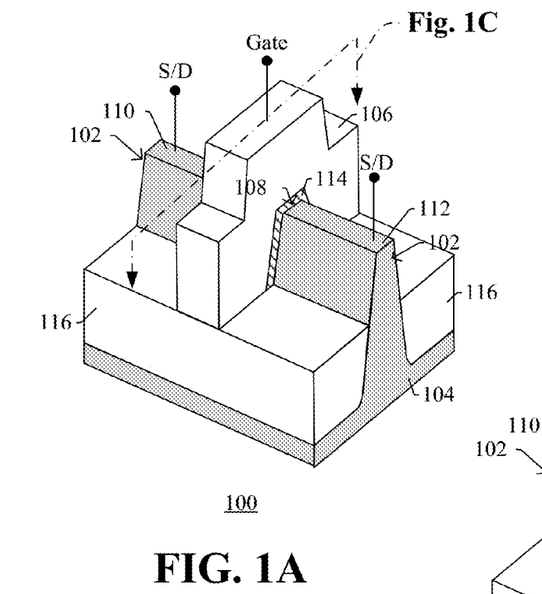
FIGS. 1A-1C illustrate a various views of a conventional FinFET that can suffer from hot carrier injection (HCI) effects.
Figure 1B:
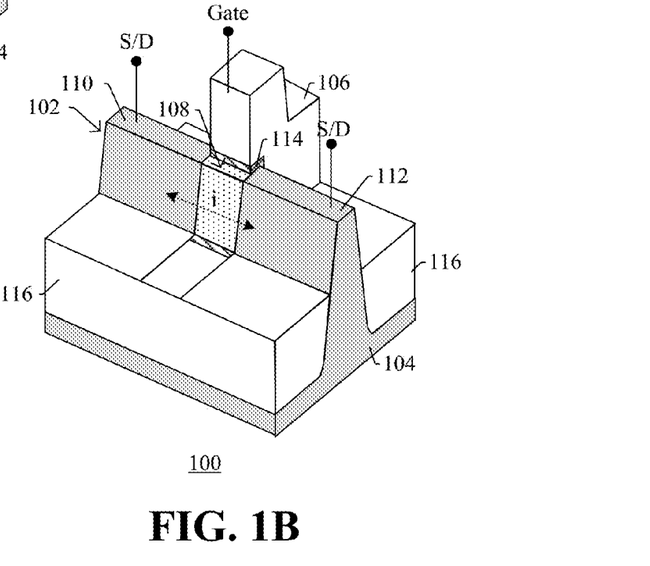
Figure 1C:
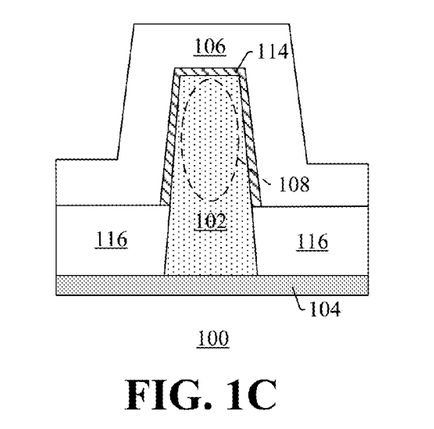

Hot carrier injection (HCI) is a phenomenon in solid-state electronic devices where an electron or a "hole" gains sufficient kinetic energy to overcome a potential barrier necessary to jump from a valence band of a semiconductor material to an energetic state that is higher than a conduction band of the semiconductor material. FIGS. 1A-1C show a conventional FinFET 100, which can suffer from HCI effects. Referring to FIGS. 1A-1C collectively, the FinFET 100 includes a semiconductor fin 102 that extends upwardly from a semiconductor substrate 104. A conductive gate electrode 106 straddles a channel region 108 of the fin 102, wherein source/drain (S/D) regions 110, 112 are arranged in the fin 102 on opposite edges of the gate electrode 106. The source/drain regions 110, 112 have a first doping type (e.g., n-type), while the channel region 108 has a second, opposite doping type (e.g., p-type). A gate dielectric 114 separates the conductive gate electrode 106 from the channel region 108, and dielectric regions 116 may also extend downward along sidewalls of a base portion of fin 102.

During operation, a gate voltage is applied to the gate electrode 106, which can cause charge carriers to accumulate in the channel region 108 or can cause inversion in the channel region 108, depending on the magnitude of the applied gate voltage. While the gate voltage is applied, a voltage between the source/drain regions 110, 112 can be concurrently applied, which will sweep charge carriers between source/drain regions 110, 112 and thereby cause current to flow (i.e., the FinFET is "on"). If a magnitude of the gate voltage is less than a threshold voltage of the FinFET, very little or no current flows between source/drain regions 110, 112 (i.e., the FinFET is "off").

In some instances, the charge carriers passing between source/drain regions 110, 112 may gain sufficient kinetic energy to become "hot", for example through carriers being excited by bias conditions, electric field discontinuities, phonons, electromagnetic radiation (e.g., light), collisions with particles (e.g., alpha-particles), and/or combinations thereof. Note that the term "hot" refers to the effective temperature used to model carrier density, not to the overall temperature of the FinFET. For example, if photon of sufficient energy strikes a valence band electron in the semiconductor material of fin 102, and excites the electron to an energy state above the conduction band, the excited electron can be referred to as a "hot" electron. Because of its high kinetic energy, such a hot electron is very mobile, and likely to leave the semiconductor fin 102 and travel into other surrounding materials. For example, "hot" carriers can travel towards the gate dielectric 114, sometimes attaining sufficient energy to tunnel through the gate dielectric 114 to undesirably show up as gate leakage current or substrate leakage current. The "hot" carriers can damage the gate dielectric 114 and thereby damage the switching characteristics of the FinFET. Further, the hot carriers may also jump between source/drain regions 110, 112 over the channel region (even if the device is "off"), leading to undesirable leakage current.

Figure 2:
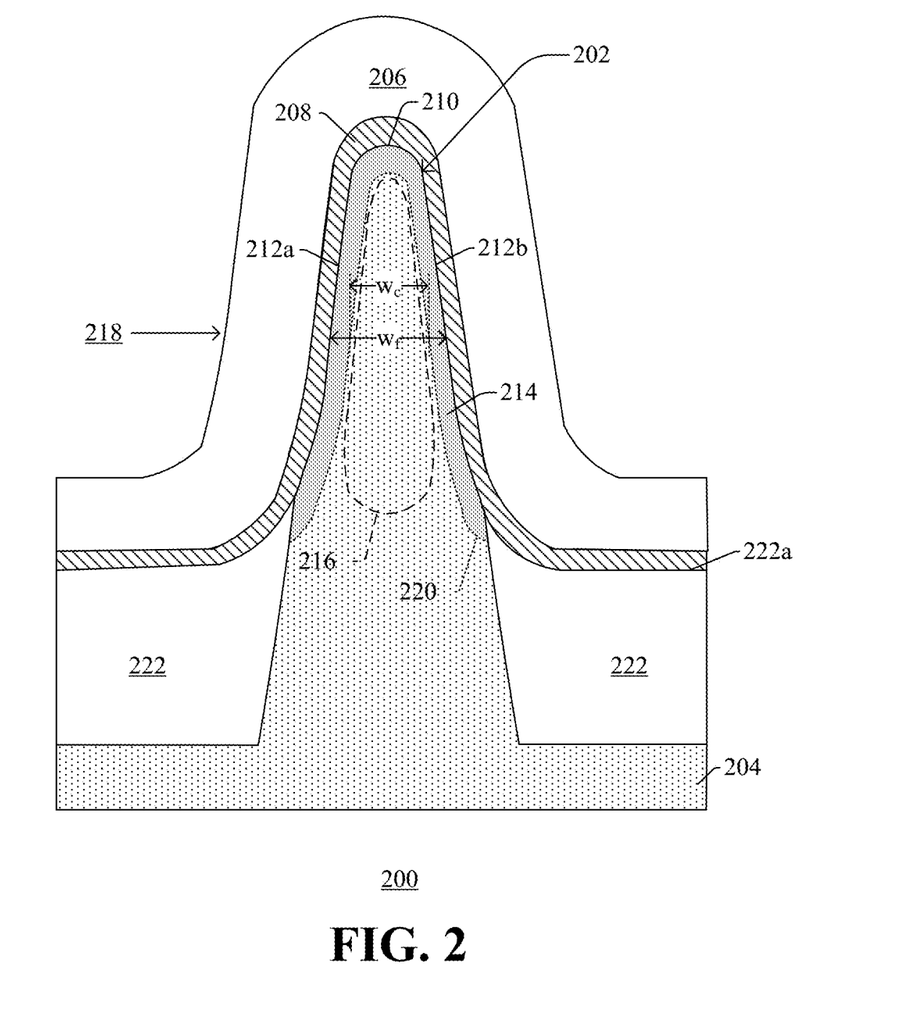
FIG. 2 illustrates a cross-sectional view of a FinFET that includes a shallow doped region under its gate to limit HCI in accordance with some embodiments.

To limit HCI effects, the present disclosure includes a shallow doped region, which has a doping type that is opposite to that of the channel region, that wraps under the gate electrode near the fin surface to push the channel region deeper into the fin. FIG. 2 shows a cross-sectional view a FinFET 200 which includes a shallow doped region in accordance with some embodiments. The FinFET 200 includes a semiconductor fin 202 which extends upwardly from a semiconductor substrate 204. A gate electrode 206 and gate dielectric 208 overlie upper fin surface 210 and outer fin sidewalls 212a, 212b. Under the gate electrode 206, the fin 202 includes a shallow doped region 214, which has a first conductivity type, and a channel region 216, which has a second, opposite conductivity type. Because the shallow doped region 214 is formed within the fin 202 and has a doping type that is opposite to that of the channel region 216, the shallow doped region 214 pushes the channel region 216 deeper into a central portion of the fin 202 compared to conventional devices, and thus limits impact ionization for hot carriers at the fin sidewalls 212a, 212b and fin upper surface 210. Therefore, the shallow doped region 214 can reduce HCI-effects. Moreover, this shallow doped region 214 can reduce the lateral electric field, particularly when the fin (e.g., upper fin surface 210) has a rounded surface geometry to limit "kinks" in the electric field, which tends to further limit HCI-effects.

In FIG. 2's illustrated embodiment, the fin 102 has a fin width, $w_f$, as measured at a vertical fin position 218. Whereas conventional FinFET channel regions would extend entirely to an underside of gate dielectric 208, the channel region 216 does not extend to the underside of the gate dielectric 208, but rather extends only to a junction 220 formed between the shallow doped region 214 and the channel region 216.

Thus, as measured at vertical position 218, the channel region 216 has a width, $w_c$, that is less than the fin width, $w_f$. In some embodiments, for example, the channel width, $w_c$, may range from approximately 95% of the fin width to approximately 10% of the fin width, $w_f$, with the remaining fin width consumed by the shallow doped region 214.

In some embodiments, the shallow doped region 214 can have a doping concentration of the first doping type of approximately 1e17 impurities/cm$^3$, whereas the channel region 216 can have a doping concentration of the second doping type of approximately 1e17 impurities/cm$^3$. Although the shallow doped region 214 is illustrated as having a lower portion that is substantially aligned to an upper surface 222a of dielectric region 222 adjacent to a base portion of the fin 202, in other embodiments, the shallow doped region 214 can extend down the entire length base portion of the fin alongside the dielectric region 222. The fin can have a height of approximately 10 nm to approximately 100 nm in some embodiments.

Figure 3A:
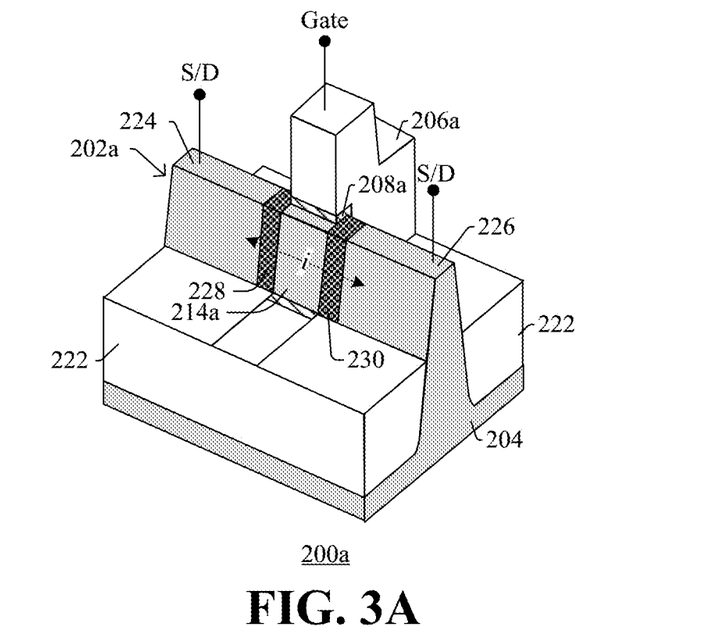
FIG. 3A illustrates a perspective view of a FinFET that includes a shallow doped region and a strain-inducing layer under its gate in accordance with some embodiments.
Figure 3B:
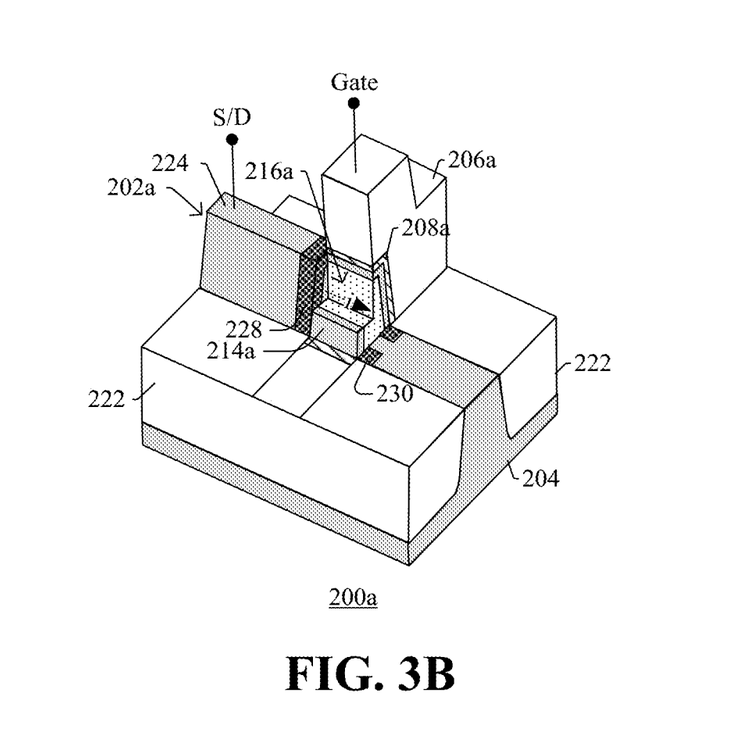
FIG. 3B illustrates a perspective view of FIG. 3A's FinFET with a portion of its gate cut-away to better show the channel region and shallow doped region in accordance with some embodiments.

FIGS. 3A-3B illustrate perspective views of a FinFET device 200a in accordance with some embodiments. Because this FinFET 200a is an example of how FIG. 2's cross-sectional view 200 can be implemented, like reference numerals in FIGS. 3A-3B are followed by an "a" in addition to those corresponding elements in FIG. 2—for example channel region 216a in FIG. 3A-3B is one example of how the channel region 216 in FIG. 2 can be implemented. Further, FIG. 3A shows the FinFET 200a with a portion of its gate electrode 206a cut-away but with its fin 202a fully in place, while FIG. 3B shows the FinFET 200a with a portion of its fin 202a additionally cut away to better illustrate some features of the disclosure.

Referring to FIGS. 3A-3B concurrently, gate electrode 206a and gate dielectric 208a overlie fin 202a at a channel region 216a, and first and second source/drain regions 224, 226 are disposed in the fin 202a about opposite edges of the gate electrode 206a. The channel region 216a physically separates the first and second source/drain regions 224, 226 from one another. The source/drain regions 224, 226 have a first doping type (e.g., n-type for an n-type FinFET), while the channel region 216a has a second, opposite doping type (e.g., p-type for an n-type FinFET). A shallow doped region 214a, which is formed in the fin 202a and has the first doping type, wraps around upper fin region and sidewall fin regions and extends continuously under the gate electrode 206a between outer edges of the gate electrode 206a. This shallow doped region 214a limits HCI effects.

Because the shallow doped region 214a has the same conductivity type as the first and second source/drain regions 224, 226, isolation regions 228, 230 are arranged in the fin on opposing sides of the gate electrode 206a. These isolation regions 228, 230 prevent the first and second source/drain regions 224, 226 from being shorted together through the shallow doped region 214a. In some embodiments, the isolation regions 228, 230 comprise doped regions having the second doping type, while in other embodiments isolation regions 228, 230 comprise an insulating material. In FIGS. 3A-3B, isolation regions 228, 230 are arranged in the fin beyond opposing outer edges of the gate electrode 206a without extending under the gate electrode 206a. To help ensure adequate electrical isolation between the source/drain regions 224, 226, in the illustrated embodiment of FIG. 3B, the isolation region 228 has an isolation region depth that is greater than a depth of the shallow doped region 214a, as measured from a sidewall surface and/or upper surface of the fin 202a. Thus, during operation when the FinFET is "on", current will flow between source and drain regions 224, 226 through channel region 216 and under isolation regions 228, 230. When the FinFET is "off", the isolation regions 228, 230 help ensure there is little or no current leakage between the first and second source/drain regions 224, 226.

Figure 4A:
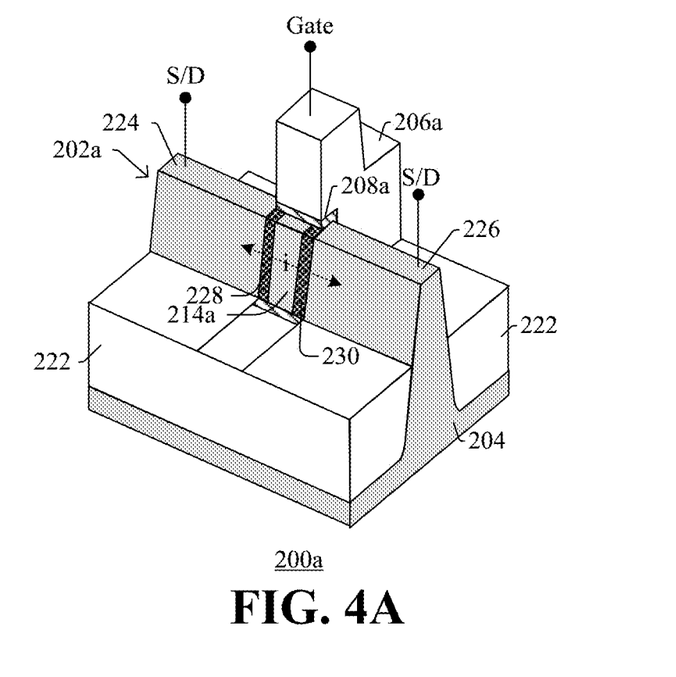
FIG. 4A illustrates a perspective view of a FinFET that includes a shallow doped region and a strain-inducing layer under its gate in accordance with some embodiments.
Figure 4B:
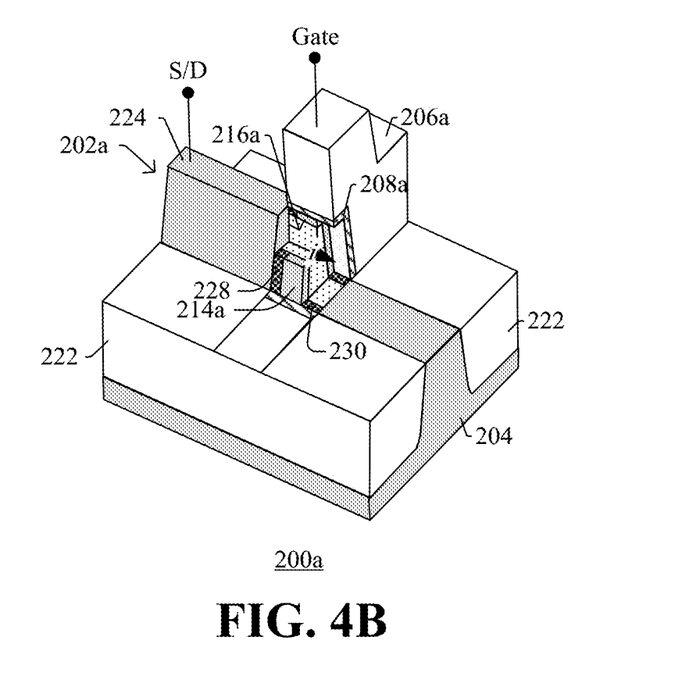
FIG. 4B illustrates a perspective view of FIG. 4A's FinFET with a portion of its gate cut-away to better show the channel region and shallow doped region in accordance with some embodiments.

FIGS. 4A-4B illustrate another example of how isolation regions 228, 230 can be implemented. In this example, the isolation regions 228, 230 are arranged under the gate electrode 206a without extending beyond outer edges of the gate electrode 206a. Because the isolations regions 228, 230 in FIGS. 4A-4B provide lateral spacing between each source/drain region 224, 226 and the shallow doped region 214a, this embodiment provides particularly good isolation, which reduces the likelihood of shorting between the first and second source/drain regions 224, 226 due to shallow doped region 214a.

Figure 5:
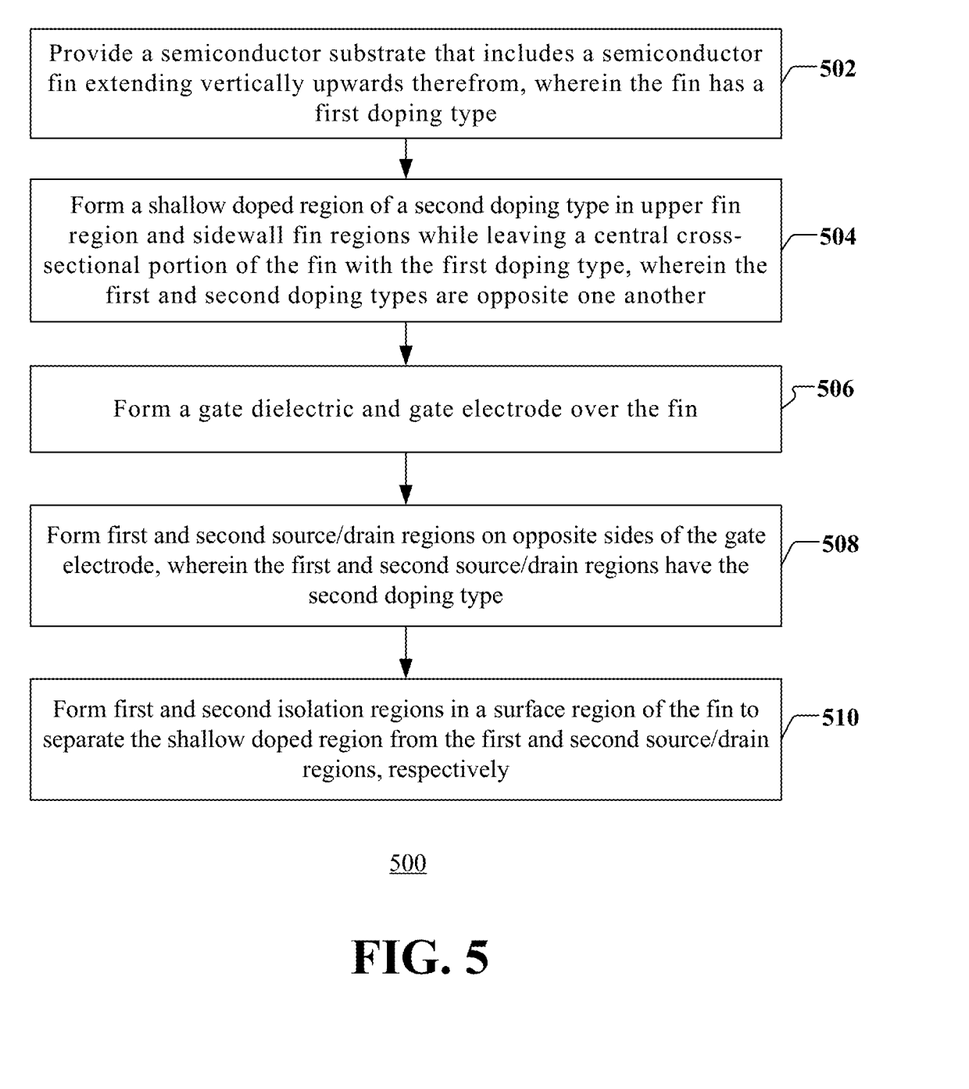
FIG. 5 illustrates a method in flowchart form that makes use of a moveable temperature sensor in accordance with some embodiments.

FIG. 5 shows a method of forming a FinFET device in accordance with some embodiments. In 502, a semiconductor substrate is provided which includes a semiconductor fin extending vertically upwards therefrom. The fin has a first doping type. In 504, a shallow doped region, which has a second doping type, is formed in upper fin region and sidewall fin regions. Formation of the shallow-doped region leaves a central cross-sectional portion of the fin with the first doping type, wherein the first and second doping types are opposite one another. In 506, a gate dielectric and gate electrode are formed over the fin. In 508, first and second source/drain regions are formed on opposite sides of the gate electrode wherein the first and second source/drain regions have the second doping type. In 510, first and second isolation regions are formed in a surface region of the fin to separate the shallow doped region from the first and second source/drain regions, respectively.

Turning now to FIGS. 6A-6C through FIGS. 10A-10C, one can see a series of views that depict a FinFET at various stages of manufacture. In particular, FIGS. 6A, 7A, 8A, 9A, and 10A show perspective views at various stages of FinFET manufacture; FIGS. 6B, 7B, 8B, 9B, and 10B show cross-sectional views of the channel region under the gate electrode, and FIGS. 6C, 7C, 8C, 9C, and 10C show cross-sectional views of regions of the fin on either edge of the gate electrode where isolation regions are formed.

Figure 6A:
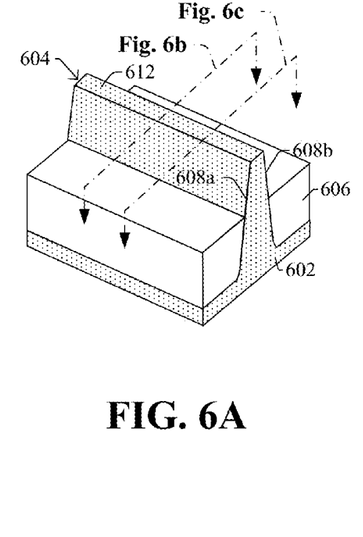
FIGS. 6A-6C through 10A-10C illustrate a series of perspective and cross-sectional views that collectively depict a method for forming a FinFET in accordance with some embodiments.
Figure 6B:
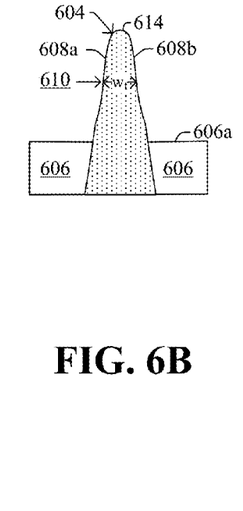
Figure 6C:
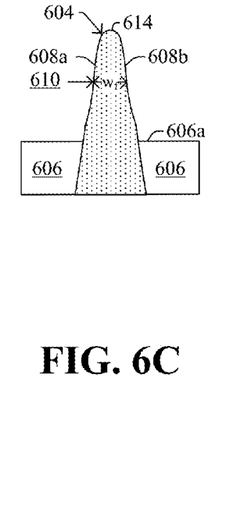

FIGS. 6A-6C show a semiconductor substrate 602 which includes a semiconductor fin 604 extending vertically upwards there from. The fin 604, which has a first doping type and is typically made of epitaxially grown silicon, has a lower portion that is flanked by dielectric regions 606 and an upper portion extending upwards beyond a dielectric region upper surface 606a. In some embodiments, the fin 604 can have an upper portion that is narrower than the base portion, such that fin sidewalls 608a, 608b are angled inwardly from base portion to upper portion. At approximately half of the fin height (610), the fin has a fin width, $w_f$, as measured between outer surfaces of its fin sidewalls 608a, 608b. In some embodiments, the fin can have a planar upper surface 612 (as illustrated in FIG. 6A). However, in other embodiments the upper surface can be a rounded surface 614 (see FIGS. 6b-6c), which smoothly transitions to the sidewall surfaces of the fin without having a non-differentiable point (e.g., without having a corner or kink) between the upper surface and sidewall surfaces. If present, this rounded surface 614 can help limit kinks in the electric field and thereby help ward off hot carriers from being generated.

Figure 7A:
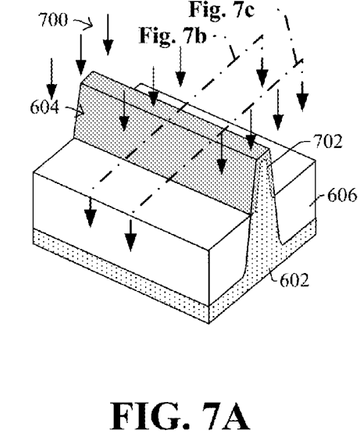
Figure 7B:
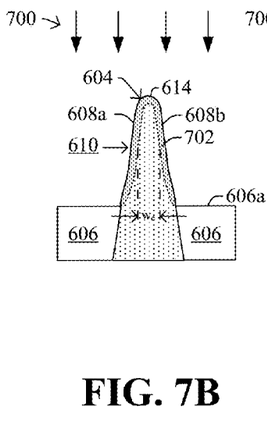
Figure 7C:
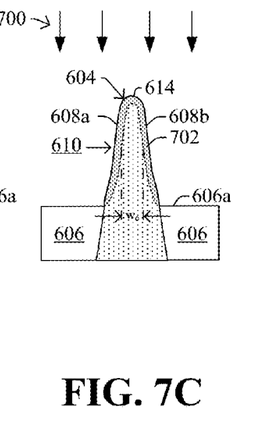

In FIGS. 7A-7C, an ion implantation 700 is carried out to form a shallow doped region 702, which has a second doping type, in upper fin region and sidewall fin regions. The ion implantation 700 can be a normal implant (which can be normal, for example, to the dielectric region upper surface 602a), can be an angled implant that is non-normal, or can be a combination of angled and non-angled implants. The shallow doped region 702 can be substantially u-shaped or v-shaped, and can conform to the fin sidewalls 608a, 608b and fin upper surface 612/614. In embodiments where solely a normal implant is used, the dopant concentration can be higher at upper fin surface 612/614 and can be lower on the fin sidewalls 610a, 610b due to the larger sidewall area relative to a unit area of normal ion beam flux.

After the ion implantation is carried out, an anneal is performed to drive the implanted ions into the fin.

Figure 8A:
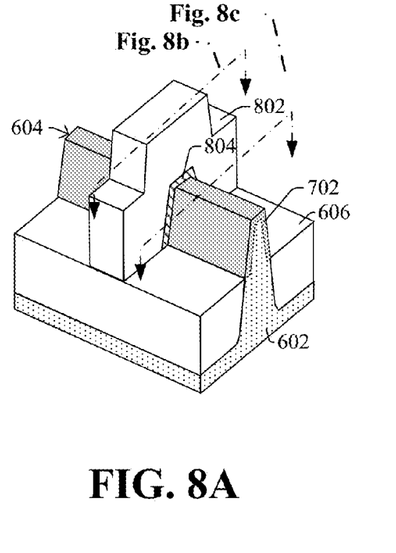
Figure 8B:
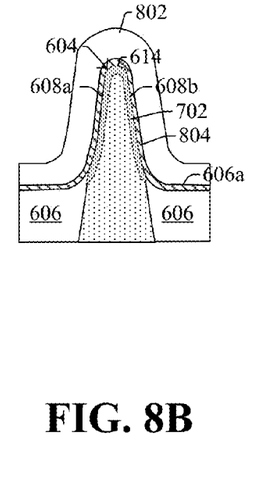
Figure 8C:
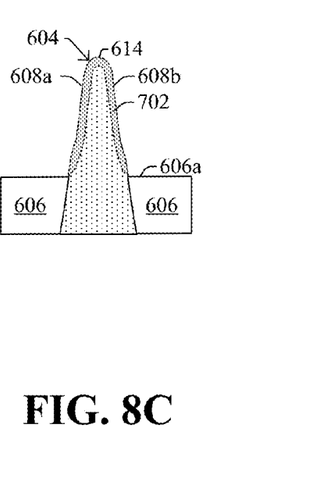

In FIGS. 8A-8C, a gate dielectric layer and gate electrode layer are formed over the fin and dielectric regions, and a gate mask (not shown) is patterned over the gate electrode layer. With the gate mask in place, an etch is carried out to removed exposed portions of the gate electrode layer and gate dielectric layer, thereby forming a gate electrode 802 and underlying gate dielectric 804. This etch also re-exposes the shallow doped region 702 on the fin sidewalls and upper fin surface which are not covered by the gate electrode 802.

Figure 9A:
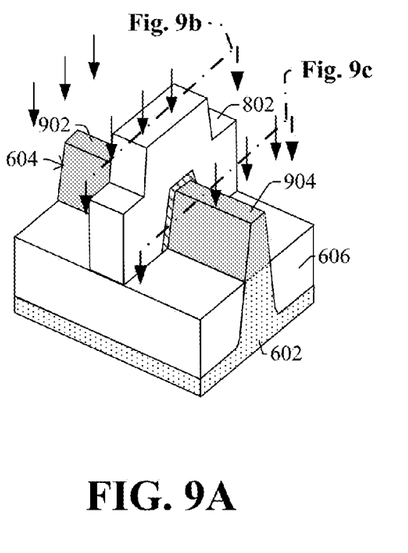
Figure 9B:
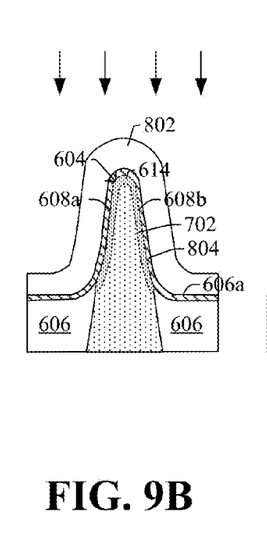
Figure 9C:
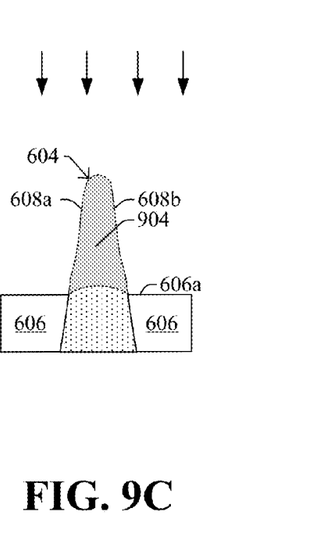

In FIGS. 9A-9C, a source/drain implant 900 is carried out to form first and second source/drain regions 902/904 on opposite sides of the gate electrode 802. Alternatively, the source/drain regions 902, 904 could be grown epitaxially. The first and second source/drain regions 902, 904 have a second doping type.

Figure 10A:
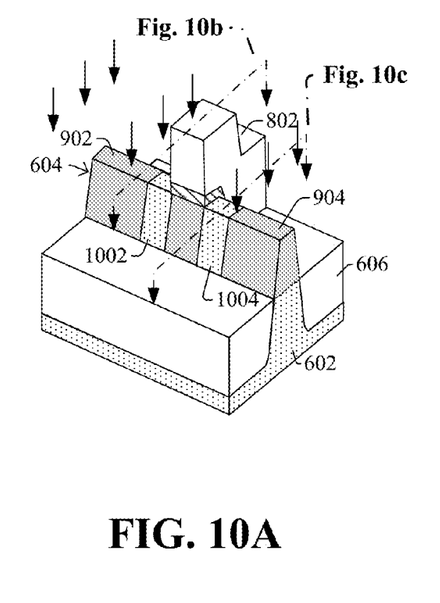
Figure 10B:
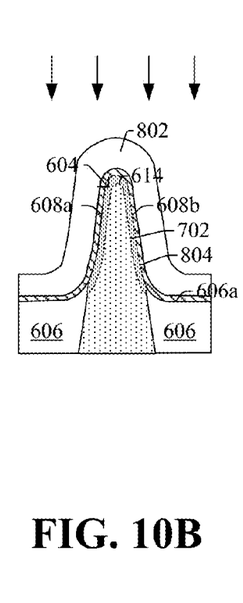
Figure 10C:
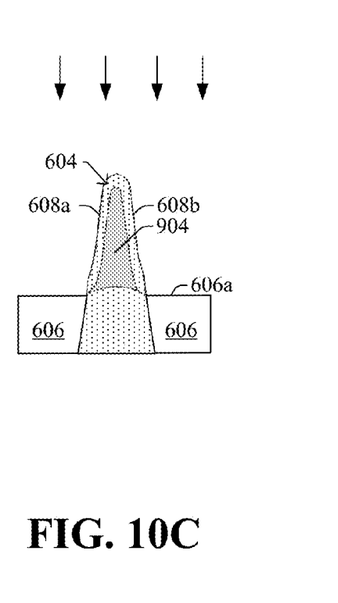

In FIGS. 10A-10C, isolation regions 1002, 1004 are formed. In one example, prior to formation of the isolation regions, a mask (not shown) can be patterned to leave the isolation regions uncovered, and then an ion implantation can be performed to form the isolation regions 1002, 1004 which are self-aligned with the gate. In this case, the ion implantation will have a doping type that is opposite to that of the source/drain regions.

It will be appreciated although the aforementioned disclosure provides examples where a shallow doped region, which can be formed by ion implantation and a subsequent anneal for example, is disposed near an upper fin surface and sidewall fin surfaces to limit HCI effects; that other structures besides doped structures could also be used to limit HCI effects. For example, an insulating material can also be disposed near an upper fin surface and sidewall fin surfaces to limit HCI effects to push a channel region of the fin deeper into a central region of the fin. These and other materials are contemplated as establishes a hot-carrier injection barrier region disposed near a surface of the fin around upper and sidewall fin regions in accordance with this disclosure.

Thus, it will be appreciated that the present disclosure relates to FinFETs that exhibit greater resiliency to HIC channel effects. One feature that can help in this regard is a shallow doped region, which has a doping type that is opposite to that of the channel region, and which wraps under the gate electrode near the fin surface to push the channel region deeper into the fin. Further, in some embodiments, curved surfaces for the FinFETS and/or improved isolation regions may also help ward off HCI effects. The end result is FinFETs that exhibit favorable characteristics, such as improved reliability over a lifetime of the device, and lower leakage currents than other devices.

Some embodiments relate to an integrated circuit (IC) including one or more finFET devices. A finFET includes a fin of semiconductor material extending upwards from a semiconductor substrate. First and second source/drain regions, which have a first doping type, are spaced apart laterally from one another in the fin. A channel region is disposed in the fin and physically separates the first and second source/drain regions from one another. The channel region has a second doping type opposite the first doping type. A conductive gate electrode straddles the fin about the channel region and is separated from the channel region by a gate dielectric. A shallow doped region, which has the first doping type, is disposed near a surface of the fin around upper and sidewall fin regions. The shallow doped region extends continuously under the gate electrode between outer edges of the gate electrode Other embodiments relate to an integrated circuit (IC) including one or more finFET devices. A finFET device includes a fin of semiconductor material extending upwards from a semiconductor substrate. First and second source/drain regions, which have a first doping type, are spaced apart laterally from one another by a channel region in the fin. A conductive gate electrode straddles the fin about the channel region and is separated from the channel region by a gate dielectric. A hot-carrier injection (HCI) barrier region is disposed near a surface of the fin around upper and sidewall fin regions. The HCI barrier region extends continuously under the gate electrode between opposing outer edges of the gate electrode.

Still other embodiments relate to a method of forming a finFET device. In this method, a semiconductor substrate is provided. The substrate includes a fin of semiconductor material extending upwardly there from. A channel region of the fin has a first doping type. An ion implantation operation is carried out to form a shallow doped region, which has a second doping type, on an upper fin region and sidewall fin regions which at least partially surround the channel region.

A gate dielectric and gate electrode are formed to straddle the channel region in the fin. The shallow doped region physically separates the channel region from an underside of the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) including one or more finFET devices, a finFET device comprising:
   a fin of semiconductor material extending upwards from a semiconductor substrate;
   first and second source/drain regions, which have a first doping type, spaced apart laterally from one another in the fin;
   a channel region disposed in the fin and physically separating the first and second source/drain regions from one another, wherein the channel region has a second doping type opposite the first doping type;
   a conductive gate electrode straddling the fin about the channel region and separated from the channel region by a gate dielectric;
   a shallow doped region, which has the first doping type, disposed in the fin along upper and sidewall regions of the fin, wherein the shallow doped region extends continuously under the gate electrode between opposing outer edges of the gate electrode; and
   first and second isolation regions arranged in the fin under respective outer edges of the gate electrode, the first and second isolation regions having inverted -u or -v shapes on opposite sides of the shallow doped region and separating the shallow doped region from the first and second source/drain regions, respectively.

2. The IC of claim 1, wherein the fin includes opposing fin sidewalls that are spaced apart by a fin width, wherein the channel region has a channel width that is less than the fin width.

3. The IC of claim 1, wherein the shallow doped region extends continuously through an outer surface region of the fin beyond outer edges of the channel region and within upper and sidewall surfaces of the fin.

4. The IC of claim 1, wherein the shallow doped region has a doping concentration of approximately 1e17 impurities/cm$^3$ and wherein the channel region has a doping concentration of approximately 1e17 impurities/cm$^3$.

5. The IC of claim 1, wherein the first and second isolation regions comprise doped regions having the second doping type.

6. The IC of claim 1, wherein the first and second isolation regions comprise an insulating material.

7. The IC of claim 1, wherein the first and second isolation regions are arranged in the fin under the gate electrode without extending beyond outer edges of the gate electrode.

8. The IC of claim 1, wherein the first and second isolation regions are arranged in the fin beyond outer edges of the gate electrode without extending under the gate electrode.

9. The IC of claim 8, wherein the first and second isolation regions have an isolation region depth that is greater than a depth of the shallow doped region.

10. The IC of claim 1, wherein the upper fin region is a rounded surface that smoothly transitions to sidewall surfaces of the fin without having a non-differentiable point between an upper fin surface and the sidewall surfaces.

11. The IC of claim 1, wherein the shallow doped region has a first doping concentration in the upper fin region and a second doping concentration in the sidewall fin regions, the first doping concentration being greater than the second doping concentration.

12. An integrated circuit (IC) including one or more finFET devices, a finFET device comprising:
   a fin of semiconductor material extending upwards from a semiconductor substrate;
   first and second source/drain regions, which have a first doping type, spaced apart laterally from one another by a channel region in the fin;
   a conductive gate electrode straddling the fin about the channel region and separated from the channel region by a gate dielectric;
   a hot-carrier injection (HCI) barrier region disposed near an outer surface of the fin around and under the gate electrode, wherein the HCI barrier region extends in the fin continuously under an upper surface of the gate dielectric, along inner sidewalls of the gate dielectric and between opposing outer edges of the gate electrode; and
   first and second isolation regions arranged in the fin under the opposing outer edges of the gate electrode, respectively, the first and second isolation regions having inverted -u or -v shapes on opposite sides of the HCI barrier region and separating the HCI barrier region from the first and second source/drain regions, respectively.

13. The IC of claim 12, wherein the HCI barrier region extends continuously through an outer surface region of the fin beyond outer edges of the channel region and within upper and sidewall surfaces of the fin.

14. An integrated circuit (IC) including one or more finFET devices, a finFET device comprising:
   a fin of semiconductor material extending upwards from a semiconductor substrate, the fin having a rounded upper surface, upper fin sidewalls spaced apart by a first width, and lower fin sidewalls spaced apart by a second width greater than the first width;
   a channel region disposed in the fin and having a first doping type;
   a conductive gate electrode extending over the rounded upper surface and along the upper and lower fin sidewalls about the channel region and separated from the channel region by a gate dielectric;
   first and second source/drain regions, which have a second doping type, arranged on opposite sides of the gate electrode and being spaced apart from one another by the channel region;
   a shallow doped region, which has the second doping type, arranged in the fin and lining the rounded upper surface of the fin and lining the upper and lower fin sidewalls;
   a first isolation region arranged in the fin proximate a first side of the gate electrode, the first isolation region having an inverted -u or -v shape and separating the shallow doped region from the first source/drain region; and a second isolation region arranged in the fin proximate a second side of the gate electrode, the second isolation region having an inverted -u or -v shape and separating the shallow doped region from the second source/drain region.

15. The IC of claim 14, wherein the shallow doped region extends continuously under the gate electrode between the opposite sides of the gate electrode.

16. The IC of claim 14, wherein the fin has a bottom fin region extending upwardly between an opening in a dielectric region over the semiconductor substrate, the bottom fin region having bottom sidewalls that are spaced apart by a third width, wherein the third width is greater than the second width.

17. The IC of claim 1, wherein the first and second isolation regions extend around upper and sidewall fin regions on opposite sides of the shallow doped region so the shallow doped region does not contact the first source/drain region or the second source/drain region.

18. The IC of claim 12, wherein the first and second isolation regions extend around upper and sidewall fin regions on opposite sides of the HCI barrier region so the HCI barrier region does not contact the first source/drain region or the second source/drain region.

19. The IC of claim 17, wherein the first and second source/drain regions have innermost portions which are spaced beneath an upper surface of the fin and beneath the first and second isolation regions, the innermost portions of the first and second source/drain regions extending through openings in the -u or -v shapes of the first and second isolation regions to contact opposite sides of the channel region.

* * * * *